United States Patent [19]
Platzer
[11] Patent Number: 4,581,996
[45] Date of Patent: Apr. 15, 1986

[54] ALUMINUM SUPPORT USEFUL FOR LITHOGRAPHY

[75] Inventor: Stephan J. Platzer, New Brunswick, N.J.

[73] Assignee: American Hoechst Corporation, Somerville, N.J.

[21] Appl. No.: 357,926

[22] Filed: Mar. 15, 1982

[51] Int. Cl.[4] .......... G03F 7/08; C25D 11/04; B41N 1/08

[52] U.S. Cl. .......... 101/459; 204/33; 430/157; 430/302

[58] Field of Search .......... 101/459, 401.1, 401.2; 204/33, 129.43; 430/141, 157, 302

[56] References Cited

U.S. PATENT DOCUMENTS

| | | | |
|---|---|---|---|
| 308,043 | 11/1884 | Shaw | 101/401.2 |
| 993,938 | 5/1911 | Achert | 101/401.1 |
| 2,603,564 | 7/1952 | Maxcy . | |
| 3,069,267 | 11/1962 | Herrick . | |
| 3,282,208 | 11/1966 | Ruderman . | |
| 3,330,743 | 7/1967 | Jestl | 156/651 |
| 3,573,917 | 4/1971 | Okamoto . | |
| 3,856,529 | 12/1974 | Schadlich | 96/81 |
| 3,861,917 | 1/1975 | Magnotta | 96/33 |
| 3,887,447 | 6/1975 | Sheasby et al. . | |
| 4,087,341 | 5/1978 | Takahashi | 204/129.43 |
| 4,148,646 | 4/1979 | Zweig . | |
| 4,152,158 | 5/1979 | Chu . | |
| 4,211,619 | 7/1980 | Usbeck | 204/33 A |
| 4,224,397 | 9/1980 | Zweig | 430/157 |
| 4,301,229 | 11/1981 | Sakaki | 204/33 |

FOREIGN PATENT DOCUMENTS

| | | | |
|---|---|---|---|
| 955449 | 10/1974 | Canada . | |
| 36672 | 9/1981 | European Pat. Off. | 101/459 |
| 1813444 | 12/1968 | Fed. Rep. of Germany . | |
| 1813443 | 12/1968 | Fed. Rep. of Germany . | |
| 132294 | 10/1980 | Japan | 101/459 |
| 726755 | 7/1953 | United Kingdom . | |
| 983366 | 6/1961 | United Kingdom . | |
| 1294360 | 11/1969 | United Kingdom . | |
| 1582620 | 5/1978 | United Kingdom . | |
| 2019022 | 10/1979 | United Kingdom | 101/459 |
| 2058136 | 8/1980 | United Kingdom . | |
| 2047274 | 11/1980 | United Kingdom | 204/33 |

*Primary Examiner*—Clyde I. Coughenour
*Attorney, Agent, or Firm*—Richard S. Roberts

[57] ABSTRACT

An improved substrate suitable for use as a base for a lithographic printing plate, especially a plate useful for the production of continuous tone images. The substrate is produced by extremely uniformly graining an aluminum sheet which has a highly polished, mirror-like surface.

9 Claims, No Drawings

ALUMINUM SUPPORT USEFUL FOR LITHOGRAPHY

BACKGROUND OF THE INVENTION

This invention relates to an improved substrate suitable for use as the base of a lithographic printing plate, especially a plate useful for the production of continuous tone images.

Lithography or planographic printing is carried out by use of a printing plate with a substantially flat surface. The printing plate is chemically treated to bring about a printing surface, so that the printing area will accept oily ink and repel water, and so that the non-printing area will accept water and repel the oily ink. In performing the printing process the plate is moistened with water and inked, following which the plate is pressed in offset printing, against a rubber blanket which transfers the inked image to the paper being printed or in direct printing directly against the paper being printed.

A goal of lithographic printing is to produce extremely high quality images similar to those obtained from a photographic print. Conventional photographic materials have an average silver halide grain size of approximately one micrometer. To date, such a goal has not been reached.

Substantially all present day printing involving differences in tone from one part of the printed area to another is done by a halftone process. In accordance with this process separated solid areas like the elements of a stencil are what are printed. These solid areas are small dots of solid material which dots vary in size in direct relationship to the tones being matched. The dots are so small, however, that the presence of them is not distinguishable to the naked eye from a conventional viewing distance but their size variations create the optical illusion of variations in tonal values.

As is well known, the halftone process involves exposing the original copy to be duplicated through a camera lens and a cross-ruled glass or film screen. This screen, in some manner, breaks down the different tones into dots of varying size as just indicated. The photosensitive element or printing plate which eventually receives the screened image is then used to run off proofs for comparison with the original copy before the actual press run. Of course, when the copy to be duplicated is in color this must be broken down into three or four colors, each of the three or four colors being processed in the manner just described.

To date this halftone system has been about the sole one used, and it is almost universally used in photomechanical printing where large numbers of copies are desired. Nevertheless, it leaves much to be desired for a great deal of sharpness, color purity and detail are lost in utilizing halftone screens. The screens are approximately ten lines per millimeter, that is, a line separation distance of 100 micrometers for reasonable, high quality printing. All tones are degraded, and final proofs can never compare to the original copy.

A further disadvantage of the halftone process is the so-called moire effect which occurs if the orientation of the screen pattern is slightly different from the orientation of a regular pattern in the image and/or if two or more printed screened images are slightly misaligned during overlay printing. This affects reproduction of the picture in a manner that is usually not desired. A further disadvantage is that production of the necessary screen films is relatively expensive.

It is also known to print continuous tone pictures by the offset process from aluminum plates with fine-grained surfaces, without the use of a screen pattern. In this case printing is done "from the grain of the plate". The printing process is known as "screen-less planographic printing". This process is free from the three disadvantages mentioned above, but another disadvantage, causing great difficulties, is associated therewith, since it enables only relatively few shade gradations to be reproduced. Also, no procedure is yet known for obtaining printing plates in a reliably reproducible manner. Furthermore, the number of prints obtainable from a plate is relatively small.

Various methods are known in the art to produce a photosensitive coating which, when applied to a substrate and exposed through a continuous tone transparency, will produce a substantially continuous toned image, i.e., one which has a long tonal range or gray scale. However, the production of such a coating is in itself insufficient. One must examine the quality of each gray scale step for distinctness of the image and fineness of the grain within each step as well as the ability to use a plate having such a coating, for making thousands of consistent reproductions. It has been found that the surface topography of the substrate is a critical element to achieve this effect.

SUMMARY OF THE INVENTION

It is therefore an object of the present invention to provide an improved aluminum surface suitable for use as the base of a lithographic printing plate.

The invention provides a support for a lithographic plate comprising an aluminum or aluminum-alloy plate, and a process for producing it to provide a surface which has been treated and/or grained such that the grain structure comprises pits and:

(i) the distribution of pit diameters is such that the arithmetic mean of the pit diameters (Da) is in the range of about $0.5 \leqq Da \leqq 4.0\mu$; and (ii) at least about 99% of all pits have a diameter $(D99) \leqq 10\mu$; and (iii) a pit diameter directionality $(Dd) \leqq$ about 10%; and (iv) the total surface area (A) of said plate having either no pits or pits with a diameter of less than or equal to $0.5\mu$ is less than about 20% of said surface area;

(v) the center-line average roughness (Ra) of said surface is in the range of from about 0.2 to about $1.4\mu$; and (vi) a roughness directionality $(Rd) \leqq$ about 10%.

The invention further provides a lithographic printing plate which comprises a lithographically suitable photosensitive coating borne by the aforesaid support. In particular, the invention employs a photosensitive coating which has an exceptionally long tonal range so as to provide a continuous tone printing plate.

DETAILED DESCRIPTION OF THE PREFERRED EMBODIMENT

There are various, well known methods in the art for producing a lithographic photosensitive composition having a long tonal range. However, this is only one of several criteria required for producing a quality continuous tone printing plate. It is a well recognized problem in the art to produce an extremely high quality continuous tone printing plate. That is, one which will not only have a long tonal range, but also have exceptionally high resolution within each gray scale step, and which also possesses a relatively long printing press life without appreciable image degradation.

It has been found that the surface topography of the printing plate substrate is a crucial factor in producing a commercially acceptable continuous tone plate. It is well recognized that the vast majority of printing plates are manufactured by employing an aluminum substrate which is optionally grained or etched, anodized, and/or hydrophilized. To the surface of such a treated substrate is applied a lithographically suitable photosensitive composition which comprises sensitizers, such as diazonium salts, diazides, azides or photopolymers in admixture with binding resins, colorants, surfactants and other art recognized ingredients.

It has been found that an aluminum substrate which has been treated and grained so as to provide a very specific surface topography is exceptionally advantageous in the production of lithographic printing plates, especially continuous tone plates. Surface graining may be analyzed and measured by several methods. Standard methods include visual observation using a scanning electron microscope and instrument measurements such as with a profilometer which traces a known linear distance on the plate with a highly sensitive needle.

The diameters of the grained pits are determined from photomicrographs at magnifications between 1000 and 2000× using a scanning electron microscope with the incident electron beam perpendicular to the aluminum surface. For each sample, a square representative area, containing at least one thousand pits, is selected for measurement. The diameter of each pit is measured in the surface plane both parallel and perpendicular to the milling or rolling axis, or as it is sometimes called, the web direction. It is taken as the maximum length across the pit along the particular axis and recorded. All diameters less than 0.5μ are excluded from the following calculations. The arithmetic mean diameters of the parallel and perpendicular diameters are calculated separately.

The average pit diameter (Da) is calculated as the average of the parallel and perpendicular arithmetic mean diameters and the diameter directionality (Dd) as the percent difference between these two arithmetic mean diameters. The 95% pit diameter (D95) is the diameter which 95% of both the parallel and perpendicular diameters are less than or equal to. Similarly, the 99% pit diameter (D99) is the diameter which 99% of all the diameters are less than or equal to.

Areas with clearly no pits or pits with diameters less than 0.5μ along either axis are determined and added together. The non-pitted area (A) is calculated as the percentage of this summed area relative to the total area.

The roughness of the pitted surface is measured both parallel and perpendicular to the milling or rolling axis using a profilometer over a representative length of at least 2 mm. The center-line roughness values are calculated separately from the two traces as the arithmetic mean of the absolute distance of all points on the surface from the center-line. The average center-line roughness (Ra) is calculated as the average of the parallel and perpendicular center-line roughness values and the roughness directionality (Rd) as the percent difference between these two center-line roughness values.

The parameters which have been determined to be useful for the present invention are pit diameters, their size distribution and directionality, the surface roughness and its directionality, and the amount of non-pitted areas.

The plate surface must be etched and/or grained in order to provide sufficient anchoring of the subsequently applied treatments to provide a useful plate. While in the past, plates have been produced using no graining at all, such plates have very little usefulness since coatings do not adequately adhere to their surfaces. For the production of the high quality plates comtemplated by the present invention, the surface must be grained very finely, i.e. a limited pit diameter and depth, the plate must be very uniformly grained across the entire area of the plate, and the grain must be extremely non-directional. In the production of the vast majority of aluminum used for lithographic substrates, where super-fine quality is not required, directionality of grain is not important and the plates can be very directional. Directionality results from the rolling or milling process by which the aluminum is flattened and then wrapped around a core. In this process, a thick bar of aluminum is pressed again and again by high pressure rollers until a very long, very thin roll of aluminum results. Unfortunately, this process impacts a directional pattern to the sheet which is parallel to the direction of the rolling operation. When this sheet is then grained, for example by known electrochemical methods, the pits tend to follow the line of this directional pattern. In most commercial printing plates, halftone dots which are formed from the photosensitive image, bridge these directional pits without significant detriment. However, this has presented a significant problem to continuous tone plates where the image is produced from coating particles which are substantially smaller than halftone dots. It has been found that this problem has been overcome by an aluminum plate which has a grained surface topography meeting the following criteria:

(i) the distribution of pit diameters is such that the arithmetic mean of the pit diameters (Da) is in the range of about 0.5μ≦Da≦4.0,μ; preferably 0.5μ≦Da≦3.0μ and more preferably 1.0μ≦Da≦3.0μ and
(ii) at least about 99% of all pits have a diameter (D99)≦10μ; more preferably ≦8μ and
(iii) a pit diameter directionality (Dd) ≦ about 10%; more preferably ≦5%; and
(iv) the total surface area (A) of said plate having either no pits or pits with a diameter of less than 0.5μ is less than or equal to about 20%, more preferably ≦10% of said surface area; and
(v) the center-line average roughness (Ra) of said surface is in the range of from about 0.2 to about 1.4μ; more preferably 0.8μ≦Ra≦1.2μ; and
(vi) a roughness directionality (Rd)≦ about 10% or more preferably ≦5%.

Preferably, 95% of all pits should have a diameter (D95)≦8μ; more preferably ≦6μ.

In all cases, μ means microns or micrometers.

In the production of the substrate of the present invention, it has been found most advantageous to use highly pure aluminum alloys having an aluminum content of 98.5% or higher. Alloys containing from about 99.95% to about 99.99% aluminum are most preferred.

The surface of the aluminum alloy must be highly polished before graining. Such a surface preferably has a center-line roughness value along both the parallel and perpendicular axes reading ≦0.10μ, more preferably ≦0.08μ and most preferably ≦0.05μ. The perpendicular center-line roughness value (R) is given because it is the larger of the two values. This surface may be achieved in any of a variety of ways such as:

1. Cold rolling the aluminum under high pressures to force down the grain structure.
2. Melting the aluminum surface with a laser.
3. Chemically polishing high purity aluminum in an aqueous solution containing phosphoric acid, sulfuric acid and nitric acid.
4. Electrochemically polishing high purity aluminum by anodizing in a methanol solution containing perchloric acid.
5. Mechanically polishing the aluminum surface, for example, using a paste type polish with, for example, 0.05μ aluminum oxide particles in suspension.

Other known polishing techniques may be used if the above noted center-line roughness value is attained. Either before and/or after such polishing, the aluminum surface is preferably cleaned and/or degreased and/or etched by methods well known in the art. Such methods include treatment with such compositions as sodium hydroxide with or without degreasing and/or chelating agents, trichloroethylene, acetone, methanol, or Grisal (Hoechst AG). The composition may also optionally contain a source of aluminum ions such as sodium aluminate up to the saturation point. The ions, when added are used to enhance processing consistency. The skilled artisan can easily determine the concentrations and other treatment conditions depending upon the specific surface sought to be achieved. This step usually takes from about 15 seconds to about 5 minutes. This highly polished surface is then subjected to a very uniform graining treatment which is known in the art. Such graining methods include slurry, chemical and electrochemical processes. Of these, electrochemical graining is the most preferred procedure. Electrochemical graining may be conducted in an electrolyte containing acids such as nitric or hydrochloric acid with optional additives such as boric acid, hydrogen peroxide, aluminum chloride and aluminum nitrate up to about the saturation point to aid processing consistency and enhance the electrical conductivity of the electrolyte. Typically the nitric or hydrochloric acid is present in the aqueous electrolyte in an amount of from about 1-20 grams/liter while maintaining a temperature of from about 20° C. to 60° C. Current is applied through the aluminum and an electrode, such as lead or stainless steel, at an electrode to aluminum distance of from about 0.1 to 20 cm. Current density applied is from about 0.1 to 200 amperes per square decimeter. Graining time ranges from about 0.1 second to about 5 minutes with about 15 seconds being the most preferred. The skilled artisan may select his preferred operating parameters from these ranges or may alter them as required for his particular use provided the aforesaid surface topography features are attained.

In order to increase the length of run of the printing plate, the grained substrate may then optionally be anodized by any of the various methods known in the art. These include employing electrolytes comprising sulfuric, phosphoric or oxalic acids in concentrations of up to about 200 grams per liter while being maintained at about 20° C. to about 40° C. Current density applied is up to about 30 Amp/dm$^2$ to produce an oxide coating of up to about 10 g/m$^2$. The anodizing electrolyte may also optionally contain such other useful ingredients as are well known to the skilled artisan, including aluminum sulfate up to the saturation point to aid processing consistency and enhance the electrical conductivity of the electrolyte.

The anodized surface is then optionally hydrophilized by applying, via chemical or electrochemical methods, a coating of a hydrophilizing agent such as polyvinyl phosphonic acid, sodium silicate or any of the other such interlayer hydrophilizing agents which are well known to those skilled in the art.

The finely grained substrate produced by this invention has been found to be highly advantageous when producing many varieties of printing plates but is extraordinarily advantageous in producing continuous tone printing plates. When producing a continuous tone printing plate, one must apply a photosensitive coating to the substrate which will give an extremely long tonal range. It is also desirable to expose and develop the plate in a manner which is conducive to producing such a long tonal range consistently. Many such coatings are known in the art and may be employed as a part of the structure of this invention. These include coatings employing diazo compounds such as diazonium salts, diazides, azides, and photopolymers as the photosensitizing agent, in mixture with various other ingredients such as binding resins, uv absorbers, colorants, solvents and plasticizers.

In non-continuous tone lithography, one desires to produce a very contrasting image; i.e., one with a very short tonal range. Exposure is normally tested by the skilled artisan by exposing the test plate to actinic light through an exposure guide having a stepwise incremental optical density. One standard guide is a Stouffer 21 step exposure guide which has 21 density steps in increments of 0.15 density units. An ideal high contrast coating is one where one step is totally black when developed and its next step is totally clear. In reality, this is almost impossible to attain and the artisan must content himself with a very few intermediate gray or ghost steps. In contradistinction, producers of continuous tone images desire a coating which will produce very many gray steps and hence a low contrast. Continuous tone printers desire at least seven and preferably twelve to thirteen or even more gray scale steps from their coating. Long tonal range image may be achieved by many coating variations which are known to the skilled worker. These include adding ultraviolet absorbers to the coating, increasing the dried coating weight per unit plate area, and changing developer compositions by methods known to the skilled artisan.

Non-limiting examples of suitable photosensitizers include diazonium salts such as poly-(3-methoxy-4'-dibenzylether-4-diazo-diphenylamine-2',4',6'-trimethylsulfonate) and azides such as:

2,6-di-(4'-azidobenzal)cyclohexanone; and diazides such as:

2,3-dihydroxy-4-naphthoquinone-(1',2')-diazide-(2')-5'-sulfonyloxybenzophenone; and 2,2'-bis(naphthoquinone-(1',2')-diazide-(2')-5'-sulfonyloxy)-di-(1,1')-naphthylmethane.

Also included are those photosensitive compositions taught in U.S. Pat. Nos. 2,603,564; 3,069,268; 3,282,208; 3,861,917; 3,856,529; 4,148,646; 4,224,397 and 4,308,368; which are incorporated herein by reference.

Typical binding resins include phenolic novolaks, polyisoprene, alkyl phenolics, and polyvinyl formals. Preferred uv absorbing dyes include benzotriazoles, benzophenones, cinnamates and salicylates. Non-limiting examples of suitable ultraviolet absorbers include:

2-(((2'-hydroxyphenyl)imino)methyl)-phenol;

2-hydroxy-4-methoxybenzophenone;
2,2',4,4'-tetrahydroxybenzophenone;
2,2'-dihydroxy-4,4'-dimethoxybenzophenone;
2(2'-hydroxy-5'-methylphenyl)benzotriazole; and
phenyl salicylate.

Preferred developer compositions comprise solutions containing such ingredients as sodium metasilicate, trisodium phosphate, monosodium phosphate, and alkyl hydroxides in water for diazide coatings; n-propanol in water for diazonium salt coatings; and benzene for azide coatings.

The following non-limiting examples serve to illustrate the invention:

EXAMPLE 1

A web of aluminum alloy is prepared with the following composition: 0.12 weight % Cu, 1.20 weight % Mn, and 98.68% Al. Both sides of the material have R equal to approximately 0.25μ. The web is cut into sheets. A sheet is mechanically polished for 15 minutes with alumina paste having an average particle diameter of 0.05μ. The R value of the polished side is 0.01μ.

The polished aluminum sheet is briefly dipped into trichloroethylene, acetone, and then methanol at room temperature. It is subsequently immersed for 1 minute in an aqueous solution of 40 g/l sodium hydroxide at 25° C. The polished side of the sheet is then electrochemically etched in an aqueous solution of 20.0 g/l concentrated nitric acid at 25° C. A current density of 100 amp/dm$^2$ at 50 Hz AC is used for 15 seconds. The counter electrode is made of stainless steel. The SEM photomicrographs of the etched surface indicate that Da=1.2μ, Dd=3.2%, D95=3.5μ, D99=6.5μ, A=9%, Ra=0.62μ, and Rd=2.3%.

EXAMPLE 2

A web of aluminum alloy is prepared with the composition of 0.01 weight % Fe and 99.99 weight % Al. Both sides of the material have R equal to approximately 0.8μ. The web is cut into sheets. Two sheets are briefly dipped into trichloroethylene, acetone, and then methanol at room temperature. They are subsequently immersed for 3 minutes in an aqueous solution containing 200 g/l concentrated phosphoric acid (33.5–36.5 weight %), 200 g/l concentrated sulfuric acid and 20 g/l concentrated nitric acid at 70° C. The R values of the two chemically treated sheets are about 0.09μ.

The treated sheets are immersed for 1 minute in an aqueous solution of 40 g/l sodium hydroxide at 25° C. They, acting as the two electrodes, are then electrochemically etched in an aqueous solution of 20.0 g/l concentrated nitric acid at 20° C. A current density of 75 amp/dm$^2$ at 50 Hz AC is used for 20 seconds. The SEM photomicrograph of the etched surface indicate that Da=2.6μ, Dd=8.2%, D95=6.5μ, D99=9.5μ, A=8%, Ra=1.18μ, and Rd=7.7%. One of the etched sides is then anodized in an aqueous solution of 150 g/l phosphoric acid at 25° C. A direct current voltage of 40 V is used for 4 minutes.

EXAMPLE 3

A web of aluminum alloy is prepared with the same composition and surface roughness as in example 2. A sheet from this web is briefly dipped into trichloroethylene, acetone, and then methanol at room temperature. It is then anodized in a methanol solution of 7.0 weight % perchloric acid at 25° C. A direct current voltage of 20 V is used for 1 minute. The R value of the electrochemically anodized surface is 0.07μ.

The treated sheet is immersed for 3 minutes in an aqueous solution of 40 g/l sodium hydroxide at 25° C. It is then electrochemically etched in an aqueous solution of 50 g/l concentrated hydrochloric acid (36.5–38.0 weight %) at 30° C. A current density of 80 amp/dm$^2$ at 50 Hz AC is used for 20 seconds. The counter electrode is made of non-treated aluminum. The SEM photomicrograph of the etched surface indicate that Da=2.7μ, Dd=7.2%, D95=8.0μ, D99=9.5μ, A=10%, Ra=1.19, and Rd=8.5%.

The etched side is then anodized in an aqueous solution of 20 g/l concentrated sulfuric acid (95.0–98.0 weight %) at 25° C. A direct current density of 1 amp/dm$^2$ is used for 5 minutes.

EXAMPLE 4

A web of aluminum alloy is prepared with the following composition: 0.70 weight % Si, 0.41 weight % Fe, 0.11 weight % Cu, 0.01 weight % Mn, 0.01 weight % Mg, 0.01 weight % Zn, 0.02 weight % Ti, and 98.73 weight % Al. Both sides of the material have perpendicular center-line roughness values of (R) of about 0.29μ. The web is further cold worked to obtain R=0.04μ on one side and a thickness of 0.31 mm.

The aluminum web is cleaned, degreased and slightly etched via a treatment with aqueous alkaline solutions containing approximately 20 g/l sodium hydroxide, aluminum ions and a degreasing agent maintained at approximately 50° C. to 70° C. for approximately 1½ minutes. The smooth side of the web is then electrochemically etched in an aqueous solution containing approximately 20 g/l concentrated nitric acid (69.0–71.0 weight and aluminum ions at 40° C. The current density of 70 amp./dm$^2$ at 60 Hz AC is turned on for 4 seconds, off for 20 seconds, on for 4 seconds, off for 20 seconds, and on for 4 seconds. The counter electrode is made of lead. An observation using a scanning electron microscope at a magnification of 1000× reveals that the surface of the etched side has Da=1.5μ, Dd=5.1%, D95=5.0μ, D99=8.0μ, A<1%, Ra=1.12μ, and Rd=5.4%.

The etched side is subsequently anodized in an aqueous solution containing approximately 150 g/l concentrated sulfuric acid (95.0–98.0 weight %) and approximately 5 g/l aluminum sulfate octadecahydrate at 45° C. The direct current density of 26 amp/dm$^2$ is intermittently turned on for a total on-time of 10 seconds. The web is then immersed in an aqueous solution containing 2.2 g/l of polyvinyl phosphonic acid at 60° C. for 1 minute.

EXAMPLE 5

The web of aluminum alloy which is prepared in example 4 is cut into sheets. One sheet is whirler coated with a non-continuous tone coating with a 2:1 by volume methyl cellosolve: methyl cellosolve acetate solvent mixture containing 2.5 weight % poly-(3-methoxy-4'-dibenzylether-4 diazodiphenylamine-2',4',6'-trimethylsulfonate) and 7.5 weight % Formvar 12/85 (from Monsanto). The solvent is driven off by indirectly heating for 1 minute at 25° C. and for 2 minutes at 100° C. to obtain a dried coating weight of 1.0 g/m$^2$.

The light-sensitive plate is exposed through a negative 60 lines/cm screened flat to give a first solid Stouffer step at step 6, using a metal halide lamp. It is then developed by gently rubbing across the plate for 2 minutes an aqueous solution containing 11.4 weight % n-propanol and 14.1 weight % 2-propoxyethanol. It is subsequently treated with arabic gum.

The plate is run with black ink and coated paper stock on an offset press, yielding approximately 100,000 acceptable impressions. Three gray Stouffer steps are produced.

EXAMPLE 6

The web of aluminum alloy which is prepared in example 4, with a difference of 7 amp/dm$^2$ instead of 26 amp/dm$^2$ during anodizing is cut into sheets. One sheet is whirler coated with a non-continuous tone photosensitive coating of an o-xylene mixture containing 0.5 weight % 2,6-di-(4'-azidobenzal)cyclohexanone (from Fairmount) and 9.5 weight % polyisoprene (cyclized from Goodyear NATSYN-2000). The solvent is driven off by indirectly heating for 3 minutes at 25° C. to obtain a dried coating weight of 0.5 g/m.

The light-sensitive plate is exposed through a negative 60 lines/cm screened flat to give a first solid Stouffer step at step 5 using a 365 nm interference filter and a medium pressure mercury lamp. It is then spray developed for 30 seconds with benzene.

The plate is shortly thereafter run with black ink and uncoated paper stock on an offset press, yielding approximately 50,000 acceptable impressions. Two gray Stouffer steps are produced.

EXAMPLE 7

The web of aluminum alloy which is prepared in example 4 is menicus coated with a mixture of 50.00 weight % tetrahydrafuran, 39.00 weight % methyl cellosolve, 1.00 weight % n-butylacetate, 6.44 weight % Alnoval PN429 (from Hoechst), 1.65 weight % 2,3-dihydroxy-4-naphthoquinone-(1',2')-diazide-(2')-5'-sulfonyloxybenzophenone, 0.92 weight % 2,2'-bis-(naphthoquinone-(1',2')-diazide-(2')-5'-sulfonyloxy)-di(1,1')-naphthylmethane, 0.92 weight % 2-hydroxy-N-(2-hydroxyphenyl) benzamine, and 0.07 weight % Sudan Yellow (from GAF). The solvents are driven off by a blast of steady hot air at 170° C. for 30 seconds to obtain a dried coating weight of 2.9 g/m$^2$. The web is cut into sheets.

A light-sensitive sheet is properly exposed through a positive continuous-tone flat with a density range of 1.35, using a metal halide lamp. The distance between the light source and plate is approximately twice the largest dimension of the plate to assure uniform illumination of the plate. It is then developed for 3.5 minutes in a dip tank containing an aqueous solution of 3.96 weight % sodium metasilicate pentahydrate, 3.40 weight % bisodium phosphate decahydrate, and 0.34 weight % monosodium phosphate monohydrate. It is subsequently hand inked and treated with arabic gum.

The developed sheet is run with black ink and coated paper stock on an offset press, yielding approximately 60,000 acceptable impressions. Fifteen gray Stouffer steps are produced.

EXAMPLE 8

A web of aluminum alloy is prepared with the following composition: 0.12 weight % Si, 0.27 weight % Fe, 0.01 weight % Zn, 0.02 weight % Ti, and 99.58 weight % Al. Both sides of the material have R equal to approximately 0.15μ. The web is further cold worked to obtain R=0.10μ on one side and a thickness of 0.20 mm.

The aluminum web is cleaned, degreased and slightly etched via a treatment with an aqueous alkaline solution containing approximately 20 g/l sodium hydroxide, aluminum ions and a degreasing agent maintained at approximately 60° C. to 70° C. for approximately 1 minute. The smooth side of the web is then electrochemically etched in an aqueous solution containing approximately 16 g/l concentrated nitric acid and aluminum ions at about 40° C. The current density of 123 amp/dm$^2$ at 60 Hz AC is turned on for 8 seconds The counter electrode is made of lead. Calculations based on photomicrographs from a scanning electron microscope of the etched surface give Da=2.2μ, Dd=7.8%, D99=9.5μ, D95=7.5μ, A=4%, Ra=1.13μ and Rd=4.4%.

The etched side is then anodized in an aqueous solution containing approximately 150 g/l concentrated sulfuric acid and approximately 5.0 g/l aluminum sulfate octadecahydrate at 40° C. A direct current density of 10 amp/dm$^2$ is used for 8 seconds.

EXAMPLE 9

The web of aluminum alloy which is prepared in example 8 with a difference of 20 seconds instead of 8 seconds during anodizing is cut into sheets. One sheet is dry coated with a non-continuous tone coating of methyl cellosolve mixture containing 3.4 weight %, 2,3-dihydroxy-4-naphthoquinone-(1,2')-diazide-(2')-5'-sulfonyloxybenzophenone and 6.6 weight % Alnoval PN429 (from Hoechst AG). The plate is dried for 5 minutes in the horizontal position in an oven at 100° C. to obtain a dried coating weight of 3.0 g/m$^2$.

The light-sensitive plate is exposed through a positive 12 lines/mm screened flat to give a first clean Stouffer step at step 3, using a metal halide lamp. It is developed for 2 minutes in a rocker tray using an aqueous solution containing 3.96 weight % sodium metasilicate pentahydrate, 3.40 weight % trisodium phosphate decahydrate, and 0.34 weight % monosodium phosphate monohydrate at 22° C. It is subsequently hand inked and treated with arabic gum.

The plate is run with magenta ink and coated paper stock on an offset press, yielding approximately 150,000 acceptable impressions. Four gray Stouffer steps are produced.

Example of positive-working continuous tone coatings are given as follows:

EXAMPLE 10

The web of aluminum alloy which is prepared in example 8 is reverse offset coated with a mixture of 50.00 weight % methyl cellosolve, 30.00 weight % cyclohexanol, 16.00 weight % Alnoval PN430 (from Hoechst), 2.67 weight % 2,3-dihydroxy-4-naphthoquinone-(1',2')-diazide-(2')-5'-sulfonyloxybenzophenone, and 1.33 weight % Sudan Yellow (from GAF). The solvents are driven off by a blast of steady hot air at 190° C. for 5 seconds to obtain a dried coating weight of 2.5 g/m. The web is cut into sheets.

Four light-sensitive sheets are properly exposed through four color separated positive continuous tone flats with a density range of 1.00, using a metal halide lamp. It is then developed for 3.5 minutes in a dip tank containing an aqueous solution of 3.96 weight % sodium metasilicate pentahydrate, 3.40 weight % trisodium phosphate decahydrate, and 0.34 weight % monosodium phosphate monohydrate. They are subsequently given a uniform blanket exposure and treated with arabic gum.

The four sheets are run with their corresponding colored ink and coated paper stock on a high quality offset press, yielding approximately 150,000 satisfactory impressions. Ten gray Stouffer steps are produced.

EXAMPLE 11

The web of aluminum alloy which is prepared in example 4, with a difference of 7 amp/dm$^2$ instead of 26 amp/dm$^2$ during anodizing is cut into sheets. One sheet is whirler coated with a methyl cellosolve mixture containing 3.4 weight % 2,3-dihydroxy-4-napthoquinone-(1',2')-diazide-(2')-5'-sulfonyloxy benzophenone and 6.6 weight % Alnoval PN429 (from Hoechst). The solvent is driven off by indirectly heating for 1 minute at 25° C. and for 2 minutes at 100° C. to obtain a dried coating weight of 2.5 g/m.

The light sensitive sheet is properly exposed through a positive continuous-tone flat with a density range of 0.80, using a metal halide lamp. It is then developed for 30 seconds in a dip tank containing 3.79 weight % sodium metasilicate and enough sodium hydroxide to bring the pH of the aqueous solution to 13.2. It is subsequently heat treated for 5 minutes at 100° C., hand inked, and preserved with arabic gum.

The developed sheet is run with black ink and coated paper stock on an offset press with an alcohol dampening system, yielding approximately 200,000 acceptable impressions. Seven gray Stouffer steps are produced.

Example 12

The web of aluminum alloy which is prepared in example 8 is cut into sheets. One sheet is whirler coated with a 1:1 by volume methyl cellosolve: methyl ethyl ketone mixture containing 5.0 weight % 2,3-dihydroxy-4-naphthoquinone-(1',2')-diazide-(1')-5'-sulfonyloxybenzophenone and 5.0 weight % 2,2'-bis(naphthoquinone-(1',2')-diazide-(2')-5'-sulfonyloxy)-di(1,1')-naphthylmethane. The solvent is driven off by indirectly heating for 3 minutes at 100° C. to obtain a dried coating weight of 3.0 g/m.

The light-sensitive sheet is properly exposed through a positive continuous-tone flat with a density range of 1.00, using a metal halide lamp. It is then developed for 2 minutes in a rocker tray containing an aqueous solution of 7.00 weight % sodium metasilicate pentahydrate and 0.70 weight % lithium chloride.

Shortly after development, the sheet is run with black ink, and coated paper stock on an offset press, yielding approximately 10,000 acceptable impressions. Ten gray Stouffer steps are produced.

EXAMPLE 13

The web of aluminum alloy which is prepared in example 8, with a difference of 20 seconds instead of 8 seconds during anodizing is cut into sheets. One sheet is whirler coated with a methyl cellosolve mixture containing 5.0 weight % Phenodur 897 (from Schenectady), 2.0 weight % 2,3-dihydroxy-4-napthoquinone-(1',2')-diazide-(1')-5'-sulfonyloxybenzophenone, 1.0 weight %, Lemon Yellow (from Sun Chemical) and 0.5 weight % Crystal Violet Base (from BASF). The solvent is driven off by indirectly heating for 3 minutes at 100° C. to obtain a dried coating weight of 2.5 g/m.

The light-sensitive sheet is properly exposed through a positive continuous-tone flat with a density range of 0.80, using a metal halide lamp. It is then developed for 2 minutes in a rocker tray containing an aqueous solution of 1.67 weight % sodium metasilicate and enough sodium hydroxide to bring the pH of the solution to 12.7. It is subsequently treated with arabic gum.

The developed sheet is run with black ink and coated paper stock on an offset press with an alcohol dampening system, yielding approximately 30,000 acceptable impressions. Seven gray Stouffer steps are produced.

What is claimed is:

1. A support for a lithographic plate comprising an aluminum or aluminum-alloy plate, the surface of which has been treated and grained such that the treated portion has a grain structure which comprises pits and;

(i) has a distribution of pit diameters such that the arithmetic mean of the pit diameters (Da) is in the range of about $0.5\mu \leqq Da \leqq 4.0\mu$; and (ii) at least about 99% of all pits have a diameter $(D99) \leqq 10\ \mu$; and (iii) a pit diameter directionality $(Dd) \leqq$ about 10%; and (iv) a total surface area (A) of said treated plate portion having either no pits or pits with a diameter of less than or equal to $0.5\mu$, is less than about 20% of said surface area; and (v) a center-line average roughness (Ra) of said treated surface is in the range of from about 0.2 to about $1.4\mu$; and (vi) a roughness directionality $(Rd) \leqq$ about 10%.

2. The support of claim 1 further comprising an anodic coating applied to said grained structure.

3. The support of claim 1 further comprising a hydrophilizing agent applied to the grained surface.

4. The support of claim 2 further comprising a hydrophilizing agent applied to said anodized surface.

5. The support of claim 1, 2, 3, or 4 further comprising a lithographic photosensitive composition applied to at least a portion of said treated support surface.

6. The support of claim 5 wherein said lithographic photosensitive composition comprises a material capable of producing continuous tone images.

7. The support of claim 6 wherein said photosensitive composition is positive working.

8. The support of claim 6 wherein said photosensitive composition comprises a compound selected from the group consisting of diazonium salts, diazides, azides and photopolymers.

9. The support of claim 8 wherein said photosensitive composition further comprises one or more ingredients selected from the group consisting of binding resins, uv absorbers, colorants, solvents and plasticizers.

* * * * *